(12) United States Patent
Pyo et al.

(10) Patent No.: US 12,171,074 B2
(45) Date of Patent: Dec. 17, 2024

(54) DISPLAY DEVICE

(71) Applicant: LG ELECTRONICS INC., Seoul (KR)

(72) Inventors: Jonggil Pyo, Seoul (KR); Honghae Do, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/755,776

(22) PCT Filed: Nov. 3, 2021

(86) PCT No.: PCT/KR2021/015793
§ 371 (c)(1),
(2) Date: May 6, 2022

(87) PCT Pub. No.: WO2023/080268
PCT Pub. Date: May 11, 2023

(65) Prior Publication Data
US 2024/0155784 A1 May 9, 2024

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC ................ H05K 5/0217; G06F 1/1652; G02F 1/133305
See application file for complete search history.

(56) References Cited

U.S. PATENT DOCUMENTS 9,830,839 B2 * 11/2017 Song ................. H04N 5/64
9,839,145 B2 * 12/2017 Ryu ................. H10K 50/84
11,229,127 B2 * 1/2022 Hwang ............. G06F 1/1652
(Continued)

FOREIGN PATENT DOCUMENTS

JP 2017120419 7/2017
KR 1020150081228 7/2015
(Continued)

OTHER PUBLICATIONS

PCT International Application No. PCT/KR2021/015793, International Search Report and Written Opinion dated Aug. 2, 2022, 10 pages.

*Primary Examiner* — Sagar Shrestha
(74) *Attorney, Agent, or Firm* — LEE, HONG, DEGERMAN, KANG & WAIMEY

(57) ABSTRACT

A display device includes a main body including a display module for outputting an image, a bending module located at a center of a rear surface of the main body, a pair of links respectively extending in left and right directions, wherein one end of the link is coupled to the bending module, and link brackets respectively located at left and right ends of the main body, wherein the other end of each link is connected to each link bracket, the bending module changes an angle of the pair of links, and, when the bending module is driven, the other end of the link slides horizontally with respect to the link bracket. The display device is able to switch a state of the display module into a flat state or a bent state, so that a user is able to use the display device in a desired shape.

10 Claims, 14 Drawing Sheets

(56) References Cited

U.S. PATENT DOCUMENTS

| | | | |
|---|---|---|---|
| 11,567,546 B2* | 1/2023 | Kim | G06F 1/181 |
| 11,749,138 B2* | 9/2023 | Park | G09F 9/301 |
| | | | 361/679.01 |
| 2013/0207946 A1* | 8/2013 | Kim | G09G 3/03 |
| | | | 345/204 |
| 2014/0198465 A1* | 7/2014 | Park | G09F 9/00 |
| | | | 361/749 |
| 2015/0223358 A1* | 8/2015 | Nam | G06F 1/1652 |
| | | | 74/102 |
| 2015/0296641 A1* | 10/2015 | Song | H05K 5/0217 |
| | | | 361/679.01 |
| 2016/0040764 A1* | 2/2016 | Park | G09F 9/301 |
| | | | 361/679.01 |
| 2016/0127674 A1* | 5/2016 | Kim | H04N 21/42204 |
| | | | 348/739 |
| 2016/0224059 A1 | 8/2016 | Song et al. | |
| 2016/0353594 A1* | 12/2016 | Cho | F16M 11/08 |
| 2018/0220537 A1* | 8/2018 | Heo | F16M 11/045 |
| 2019/0383438 A1* | 12/2019 | Li | G06F 1/1652 |
| 2020/0409418 A1* | 12/2020 | Yoo | G06F 1/1675 |

FOREIGN PATENT DOCUMENTS

| | | |
|---|---|---|
| KR | 1020160016334 | 2/2016 |
| KR | 1020210001447 | 1/2021 |

* cited by examiner (a)

(b)

(a)

(b)

(a)

(b)

(a)

(b)

DISPLAY DEVICE

CROSS-REFERENCE TO RELATED APPLICATIONS

This application is the National Stage filing under 35 U.S.C. 371 of International Application No. PCT/KR2021/015793, filed on Nov. 3, 2021, the contents of which are all incorporated by reference herein in its entirety.

TECHNICAL FIELD

The present disclosure relates to a display device having a curved surface structure capable of improving the degree of immersion of a user who views the display device.

BACKGROUND ART

With the increasing development of information society, the demand for display devices is also increasing in various forms. In response to this trend, various display devices, for example, Liquid Crystal Display (LCD), Field Emission Display (FED), Plasma Display Panel (PDP), an electroluminescent device, etc. have recently been developed.

A liquid crystal panel of the LCD may include a liquid crystal layer, may further include a thin film transistor (TFT) substrate and a color filter substrate that are arranged to face each other on the basis of the liquid crystal panel interposed therebetween, and may display an image using light provided from a backlight unit.

As an example of an electroluminescent device, active-matrix-type organic light emitting display (OLED) devices are commercially available on the market and widely used throughout the world. Since the OLED device is a self-emitting device, the OLED device has no backlight and is advantageous in terms of a response speed and a viewing angle as compared to the LCD, so that the OLED devices are attracting attention as next-generation displays.

As described above, since the OLED device has no backlight, the OLED device can be bent and deformed in shape, resulting in implementation of a curved display module. The curved display module can increase the sense of immersion of a user. However, when a plurality of users simultaneously views the curved display module, the plurality of users may feel inconvenience in viewing images displayed on the curved display as compared to a flat panel display.

DISCLOSURE

Technical Problem

An object of the present disclosure is to provide a display device capable of changing a curvature thereof.

Technical Solutions

Provided is a display device including a main body including a display module for outputting an image, a bending module located at a center of a rear surface of the main body, a pair of links respectively extending in left and right directions, wherein one end of the link is coupled to the bending module, and link brackets respectively located at left and right ends of the main body, wherein the other end of each link is connected to each link bracket, wherein the bending module changes an angle of the pair of links, wherein, when the bending module is driven, the other end of the link slides horizontally with respect to the link bracket.

The link may include a moving bar located on a surface facing the link bracket at the other end thereof, the link bracket may include a link side block in contact with the moving bar, and the moving bar may slide within the link side block.

The link side block may further include a slide portion parallel to the rear surface of the main body, and side walls located at a top and a bottom of the other end of the link.

The moving bar may include a first friction portion protruding toward the slide portion, and a second friction portion protruding toward the side wall.

The link side block and the moving bar may contain polyacetal (POM: Poly Oxy Methylen).

A hardness of the moving bar may be greater than a hardness of the side block.

The display device may further include a bracket fastener for fastening the main body with a first portion of the link bracket located at a horizontal end of the display device, and a second portion of the link bracket located at a horizontal center of the display device may not be fastened to the rear surface of the main body.

When the main body is bent, a gap between the second portion of the link bracket and the rear surface of the main body may be widened.

A rear surface of the link bracket may include an inclined surface rearwardly protruding from a horizontal end of the display device toward a center.

The link bracket may include a stopper for restricting the slide movement of the link.

The display device may further include a bracket cover for covering the link bracket, and the cover may restrict a movement of the link in a direction of a horizontal end of the display device.

According to another aspect of the present disclosure, provided is a display device including a main body including a display module for outputting an image, a bending module located at a center of a rear surface of the main body, a pair of links respectively extending in left and right directions, wherein one end of the link is coupled to the bending module, and link brackets respectively located at left and right ends of the main body, wherein the other end of each link is connected to each link bracket, wherein the bending module includes a guide shaft extending from the rear surface of the main body, a moving block moving in a front and rear direction as the guide shaft is inserted thereinto, a pair of operation pins respectively disposed in a vertical direction on both sides of the moving block, wherein the operation pin extends through a pinhole defined at the other end of the link, and each mold bush positioned between one end of the link and the moving block, wherein, when the moving block moves in the front and rear direction along the guide shaft, an angle between the pair of links changes and a curvature of the main body changes.

The mold bush may include a pair of contact portions positioned at a top and a bottom of the pinhole and a connection portion for connecting the pair of contact portions to each other. The connection portion may be spaced apart from the operation pin by a predetermined distance so as not to interfere with driving of the link and extend in the vertical direction.

The operation pin may be fastened to the moving block by extending through a first through-hole defined in the moving block, a second through-hole defined in the contact portion, and the pinhole in the vertical direction, and may contain a material having a greater rigidity than a material of the moving block.

The display device may further include a first protrusion protruding toward the pinhole of the link along a circumference of the second through-hole, and the pinhole of the link may further include a first groove defined along a circumference of the pinhole corresponding to a height of the first protrusion.

The display device may further include a second protrusion protruding toward the moving block along the circumference of the second through-hole, and the moving block may further include a second groove defined near the first through-hole corresponding to a height of the second protrusion.

The pinhole may extend to be greater than a diameter of the operation pin in a longitudinal direction of the link.

The display device may further include a module bracket coupled to the rear surface of the main body, wherein the guide shaft is located in the module bracket, and a link fixing portion extending from the module bracket and pin-coupled to a center of pivot spaced apart from the other end of the link. When the moving block moves, one end and the other end of the link may move in opposite directions with respect to the center of pivot.

The moving block and the link may contain aluminum, the operation pin may contain SUS, and the mold bush may contain polyacetal (POM: Poly Oxy Methylen).

The display device may further include an auxiliary shaft disposed parallel to the guide shaft and extending through the mold.

The display module may include an organic light emitting diode panel.

Advantageous Effects

The display device of the present disclosure may switch the state of the display module into the flat state or the bent state, so that the user may use the display device in a desired shape.

The usability of the display device may be improved by eliminating an irregular curvature of the display module that occurs during the bending and reducing the noise caused by the friction between the members.

In addition, the durability may be improved using the material that may minimize the wear resulted from the friction occurring during the bending.

It is to be understood that both the foregoing general description and the following detailed description of the present disclosure are exemplary and explanatory and are intended to provide further explanation of the invention as claimed.

BEST MODE

Figure 1:
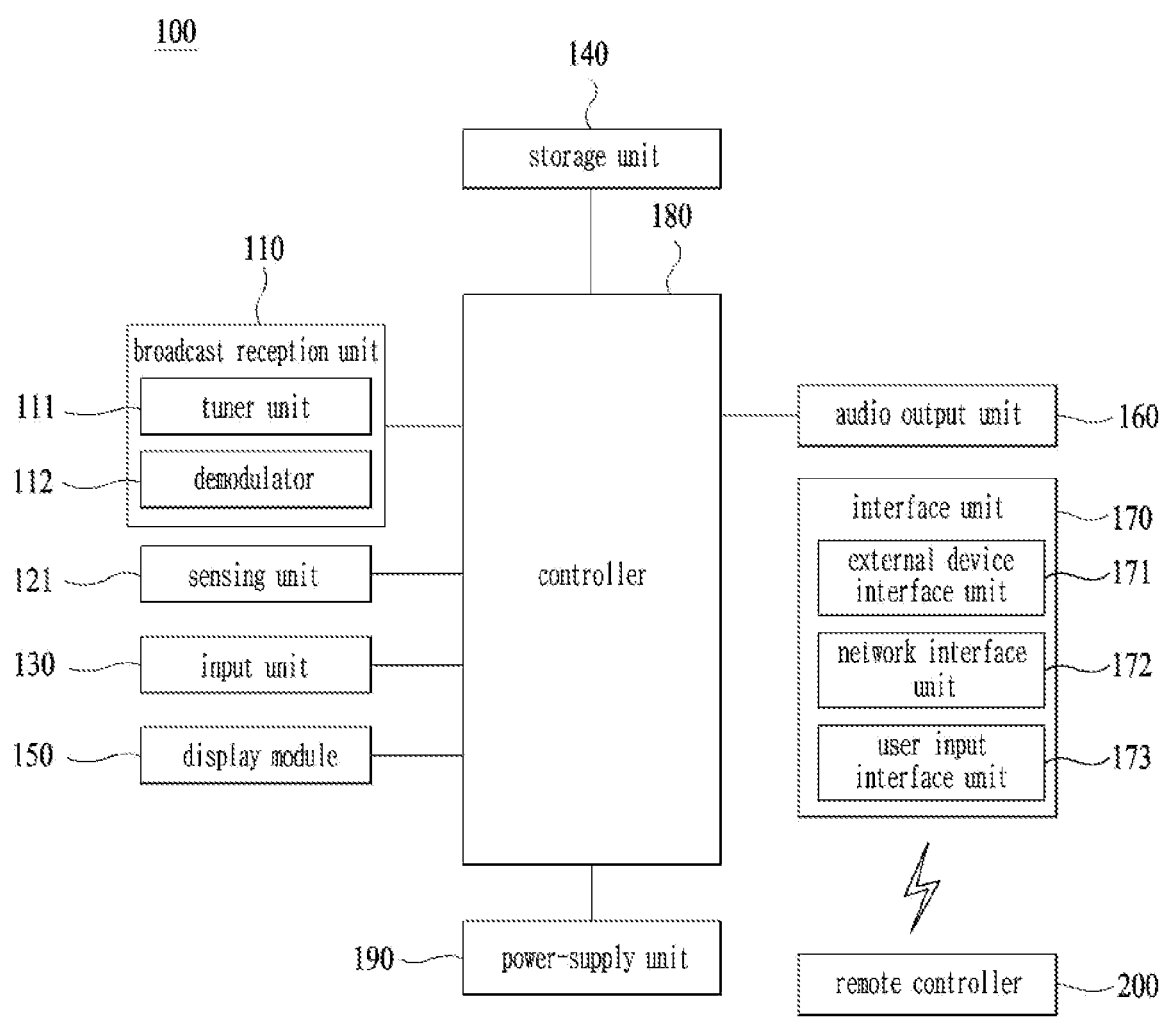
FIG. 1 is a block diagram illustrating constituent elements of a display device according to an embodiment of the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

On the other hand, the image display device described herein is, for example, an intelligent image display device implemented by adding a computer support function to a broadcast reception function, and further includes an Internet function or the like while sufficiently performing the broadcast reception function, so that the image display device may have user-friendly interfaces such as a handwriting input device, a touchscreen, or a spatial remote controller. Further, the image display device can support a wired or wireless Internet function by connecting to the Internet and a computer device, thereby performing e-mailing, web browsing, banking, or gaming. To implement these functions, the image display device may operate based on a standard general-purpose Operating System (OS).

Accordingly, the image display device according to the present disclosure is designed in a manner that various applications can be easily added to or deleted from a general-purpose OS kernel so that the image display device can perform various user-friendly functions. The image display device may be, for example, a network TV, a Hybrid broadcast broadband TV (HBBTV), a smart TV, etc. The image display device is applicable to a smartphone as needed.

FIG. 1 is a block diagram illustrating constituent elements of a display device 100 according to an embodiment of the present disclosure. Referring to FIG. 1, the display device 100 may include a broadcast reception unit 110, an external device interface unit 171, a network interface unit 172, a storage unit 140, a user input interface unit 173, an input unit 130, a controller 180, a display 150, an audio output unit 160, and/or a power-supply unit 190.

The broadcast reception unit 110 may include a tuner unit 111 and a demodulator 112.

Although not shown in the drawings, the display device 100 may include only the external device interface unit 171 and the network interface unit 172 from among the broadcast reception unit 110, the external device interface unit 171, and the network interface unit 172. That is, the display device 100 may not include the broadcast reception unit 110.

The tuner unit 111 may select a broadcast signal corresponding to either a user-selected channel or all prestored channels from among broadcast signals received through an antenna (not shown) or a cable (not shown). The tuner unit 111 may convert the selected broadcast signal into an intermediate frequency (IF) signal or a baseband image or a voice signal.

For example, when the selected broadcast signal is a digital broadcast signal, the tuner unit 111 may convert the selected broadcast signal into a digital IF (DIF) signal. When the selected broadcast signal is an analog broadcast signal, the tuner unit 111 may convert the selected broadcast signal into an analog baseband image or a voice signal (CVBS/SIF). That is, the tuner unit 111 may process the digital broadcast signal or the analog broadcast signal. The analog baseband image or the voice signal (CVBS/SIF) output from the tuner unit 111 may be directly input to the controller 180.

The tuner unit 111 may sequentially select broadcasting signals of all broadcasting channels stored through a channel memory function from among the received broadcast signals, and may convert the selected broadcast signal into an intermediate frequency (IF) signal or a baseband image or a voice signal.

The tuner unit 111 may include a plurality of tuners to receive broadcast signals of the plurality of channels. Alternatively, a single tuner for simultaneously receiving broadcast signals of the plurality of channels is also possible.

The demodulator 112 may receive the digital IF signal (DIF) converted by the tuner unit 111, and may thus perform demodulation of the received signal. The demodulator 112 may perform demodulation and channel decoding, and may output a stream signal (TS). The stream signal may be a signal formed by multiplexing an image signal, a voice signal, or a data signal.

The stream signal (TS) output from the demodulator 112 may be input to the controller 180. The controller 180 may perform demultiplexing, image/audio signal processing, etc., may output an image through the display 150, and may output a voice through the audio output unit 160.

The sensing unit 120 may sense a change in the display device 100 or may sense an external change. For example, the sensing unit 120 may include a proximity sensor, an illumination sensor, a touch sensor, an infrared (IR) sensor, an ultrasonic sensor, an optical sensor (e.g., a camera), a voice sensor (e.g., a microphone), a battery gauge, environmental sensors (e.g., hygrometer, a thermometer, etc.).

The controller 180 may check a state of the display device 100 based on information collected by the sensing unit 120, may notify the user of a problem, or may control the display device 100 to be kept in the best state.

In addition, it is possible to provide an optimal viewing environment by differently controlling the content, image quality, size, etc. of the image provided to the display module 180 depending on the viewer, ambient illuminance, etc. sensed by the sensing unit. As the smart TV has evolved, the number of functions mounted in the display device increases, and the number of the sensing units 20 also increases together with the increasing functions.

The input unit 130 may be provided at one side of a main body of the display device 100. For example, the input unit 130 may include a touch pad, a physical button, and the like. The input unit 130 may receive various user commands related to the operation of the display device 100, and may transmit a control signal corresponding to the input command to the controller 180.

Recently, as a bezel of the display device 100 decreases in size, the number of display devices 100 each including a minimum number of input unit 130 formed in a physical button exposed to the outside is rapidly increasing. Instead, a minimum number of physical buttons may be provided on the back or side surface of the display device 100. The display device may receive a user input through the remote controller 200 through a touchpad or a user input interface unit 173 to be described later.

The storage unit 140 may store a program for processing and controlling each signal used in the controller 180, and may store a signal-processed image, a voice, or a data signal. For example, the storage unit 140 may store application programs designed for the purpose of performing various tasks that can be processed by the controller 180, and may selectively provide some of the stored application programs upon request of the controller 180.

The program stored in the storage unit 140 is not specifically limited to being executed by the controller 180. The storage unit 140 may perform a function for temporarily storing an image, a voice, or a data signal received from an external device through the external device interface unit 171. The storage unit 140 may store information about a predetermined broadcast channel through a channel memory function such as a channel map.

Although the storage unit 140 of FIG. 1 is provided separately from the controller 180, the scope of the present disclosure is not limited thereto, and the storage unit 140 may also be included in the controller 180 as needed.

The storage unit 140 may include at least one of a volatile memory (e.g., DRAM, SRAM, SDRAM, etc.) and a non-volatile memory (e.g., flash memory, hard disk drive (HDD), solid state drive (SSD), etc.).

The display 150 may generate a drive signal by converting an image signal, a data signal, an OSD signal, a control signal processed by the controller 180, or by converting an image signal, a data signal, a control signal, etc. received from the interface unit 171. The display 150 may include a display panel 181 having a plurality of pixels.

A plurality of pixels included in the display panel may include RGB sub-pixels. Alternatively, a plurality of pixels included in the display panel may include sub-pixels of RGBW. The display 150 may convert the image signal, the data signal, the OSD signal, the control signal, etc. processed by the controller 180 to generate a drive signal for the plurality of pixels.

The display 150 may be implemented as a plasma display panel (PDP), a liquid crystal display (LCD), an organic light emitting diode (OLED), a flexible display, etc. In addition, the display 150 may also be implemented as a three-dimensional (3D) display. The three-dimensional (3D) display 150 may be classified into a glassless-type 3D display and a glasses-type 3D display.

The display device may include a display module that occupies most parts of the front surface, and a case that covers the back and side surfaces of the display module and packages the display module.

Recently, the display device 100 has evolved from a flat-screen display to a curved-screen display. In order to implement the curved screen, the display device 100 may use a display module 150 that can be bent or curved, such as a light emitting diode (LED) or an organic light emitting diode (OLED), etc.

Conventionally, the LCD has difficulty in self-emitting light, so that the conventional LCD has been designed to receive light through a backlight unit. The backlight unit is a device for uniformly supplying light received from a light source to a liquid crystal located on the front surface of the display device. As the backlight becomes thinner, a thin LCD can be implemented. However, it is actually difficult for the backlight unit to be implemented as a curved structure formed of a flexible material. Although the backlight unit is implemented as a curved shape, it is difficult for light to be uniformly applied to the liquid crystal, thereby changing brightness of the screen.

On the other hand, the LED or the OLED is designed in a manner that each of constituent elements constructing the pixels can self-emit light without using the backlight unit, so that the LED or the OLED can be implemented as a curved shape without any problems. In addition, since each element can perform self-emission of light, brightness of each element is not affected by a change in the positional relationship between the element and adjacent elements, so that a curved display module 150 can be implemented as an LED or OLED.

OLED (Organic Light Emitting Diode) panels appeared in earnest in mid-2010 and are rapidly replacing LCDs in the small- and medium-sized display market. The OLED is a display made using the self-emission characteristics in which OLED emits light when a current flows in a fluorescent organic compound. Since the response speed of the OLED is faster than that of the LCD, there is little afterimage when moving images are implemented.

OLEDs may be used as a light-emitting display product. In this case, the light-emitting display device may use three fluorescent organic compounds (such as red, green, and blue) each having a self-emitting function, and may use the self-emitting phenomenon in which positive(+)-charged particles and electrons injected from a cathode and anode are combined with each other within the organic material, so that a backlight unit causing degradation of color sense need not be used.

The LED panel is implemented by technology for using only one LED element as one pixel, and has a smaller LED element compared to the prior art, so that a curved display module 150 can be implemented. Whereas the conventional device referred to as an LED TV can use the LED as a light source of the backlight unit for supplying light to the LCD, it is impossible for the LED of the conventional device to constitute a screen.

The display module may include a display panel, a coupling magnet located on the rear surface of the display panel, a first power-supply unit, and a first signal module. The display panel may include a plurality of pixels (R, G, B). The plurality of pixels (R, G, B) may be formed in each region where a plurality of data lines and a plurality of gate lines cross each other. The plurality of pixels (R, G, B) may be arranged in a matrix.

For example, the plurality of pixels (R, G, B) may include a red (R) sub-pixel, a green (G) sub-pixel, and a blue (B) sub-pixel. The plurality of pixels (R, G, B) may further include white (W) sub-pixel(s).

In the display module 150, one side where an image is displayed may be referred to as a front side or a front surface. When the display module 150 displays an image, one side where no image is observed may be referred to as a rear side or a rear surface.

Meanwhile, the display 150 may be implemented as a touchscreen, so that the display 150 can also be used as an input device in addition to an output device.

The audio output unit 160 may receive a voice-processed signal from the controller 180, and may output the received signal as a voice signal.

The interface unit 170 may serve as a path of connection to various kinds of external devices connected to the display device 100. The interface unit may include not only a wired method for transmitting/receiving data through a cable, but also a wireless method using the antenna.

The interface unit 170 may include at least one of a wired/wireless headset port, an external charger port, a wired/wireless data port, a memory card port, a port connected to a device having an identification module, an audio input/output (I/O) port, a video I/O port, and an earphone port.

As an example of a wireless method, the above-described broadcast reception unit 110 may be used. The broadcast reception unit 110 may be configured to use a broadcast signal, a mobile communication short-range communication signal, a wireless Internet signal, and the like.

The external device interface unit 171 may transmit or receive data to and from a connected external device. To this end, the external device interface unit 171 may include an A/V input/output (I/O) unit (not shown).

The external device interface unit 171 may be wired or wirelessly connected to an external device such as a digital versatile disc (DVD) player, a Blu-ray player, a game console, a camera, a camcorder, a computer (laptop), a set-top box, or the like, and may perform an input/output (I/O) operation with the external device.

In addition, the external device interface unit 171 may establish a communication network with various remote controllers 200, may receive a control signal related to operation of the display device 100 from the remote controller 200, or may transmit data related to operation of the display device 100 to the remote controller 200.

The external device interface unit 171 may include a wireless communication unit (not shown) for short-range wireless communication with other electronic devices. Through the wireless communication unit (not shown), the external device interface unit 171 may exchange data with an adjacent mobile terminal. In particular, the external device interface unit 171 may receive device information, application information, an application image, and the like from the mobile terminal in a mirroring mode.

The network interface unit 172 may provide an interface for connecting the display device 100 to a wired/wireless network including the Internet network. For example, the network interface unit 172 may receive content or data provided by the Internet, a content provider, or a network administrator through a network. The network interface unit 172 may include a communication module (not shown) for connection with the wired/wireless network.

The external device interface unit 171 and/or the network interface unit 172 may include a communication module for short-range communication such as Wi-Fi, Bluetooth, Bluetooth low energy (BLE), ZigBee, Near Field Communication (NFC), and a communication module for cellular communication such as Long-Term Evolution (LTE), LTE-A (LTE Advanced), Code Division Multiple Access (CDMA), WCDMA (wideband CDMA), UMTS (universal mobile telecommunications system), WiBro (Wireless Broadband), etc.

The user input interface unit 173 may transmit user input signals to the controller 180, or may transmit signals received from the controller 180 to the user. For example, the user input interface unit 173 may transmit or receive user input signals (such as a power-on/off signal, a channel selection signal, and a screen setting signal) to and from the remote controller 200, may transmit user input signals received through a local key (not shown) such as a power key, a channel key, a volume key, and a setting key to the controller 180, may transmit a user input signal received by a sensor unit (not shown) for sensing a user gesture to the controller 180, or may transmit a signal received from the controller 180 to the sensor unit.

The controller 180 may include at least one processor, and may control the overall operation of the display device 100 using the processor included therein. Here, the processor may be a general processor such as a CPU. Of course, the processor may be a dedicated device such as an ASIC, or other hardware-based processor.

The controller 180 may demultiplex the stream received through the tuner unit 111, the demodulator 112, the external device interface unit 171, or the network interface 172, and may process the demultiplexed signals to generate and output a signal for image or voice output.

The image signal processed by the controller 180 may be input to the display 150 and displayed as an image corresponding to the corresponding image signal. In addition, the image signal processed by the controller 180 may be input to the external output device through the external device interface unit 171.

The voice (or audio) signal processed by the controller 180 may be audibly output to the audio output unit 160. In addition, the voice signal processed by the controller 180 may be input to the external output device through the external device interface unit 171. Although not shown in FIG. 2, the controller 180 may include a demultiplexer, an image processor, and the like, and a detailed description thereof will hereinafter be described with reference to FIG. 3.

In addition, the controller 180 may control the overall operation of the display device 100. For example, the controller 180 may control the tuner unit 111 to select a broadcast program corresponding to either a user-selected channel or a prestored channel.

In addition, the controller 180 may control the display device 100 by a user command or an internal program received through the user input interface unit 173. The controller 180 may control the display 150 to display an image. In this case, the image displayed on the display 150 may be a still image or a moving image, and may be a 2D image or a 3D image.

On the other hand, the controller 180 may display a predetermined 2D object in the image displayed on the display 150. For example, the object may be at least one of a connected web screen (newspaper, magazine, etc.), electronic program guide (EPG), various menus, widgets, icons, still images, moving images, and text.

Meanwhile, the controller 180 may modulate and/or demodulate the signal using an amplitude shift keying (ASK) scheme. Here, the ASK scheme may refer to a method for modulating a signal by differentiating the amplitude of a carrier wave according to data values or for restoring an analog signal to a digital data value according to the amplitude of the carrier wave.

For example, the controller 180 may modulate an image signal using the ASK scheme, and may transmit the modulated signal through a wireless communication module.

For example, the controller 180 may demodulate and process the image signal received through the wireless communication module using the ASK scheme.

Accordingly, the display device 100 may simply transmit and receive signals to and from other image display devices arranged adjacent to each other without using either a unique identifier such as a Media Access Control (MAC) address or a complex communication protocol such as TCP/IP.

On the other hand, the display device 100 may further include a photographing unit (not shown). The photographing unit may photograph a user. The photographing unit may be implemented as one camera, but is not limited thereto, and may be implemented by a plurality of cameras. On the other hand, the photographing unit may be embedded in the display device 100 or may be separately arranged on the display 150. The image information photographed by the photographing unit may be input to the controller 180.

The controller 180 may recognize the position of the user based on the image photographed by the photographing unit. For example, the controller 180 may recognize a distance (z-axis coordinates) between the user and the display device 100. In addition, the controller 180 may recognize the X-axis coordinate and the Y-axis coordinate within the display 150 corresponding to the user position.

The controller 180 may sense a user gesture based on an image photographed by the photographing unit, each of signals detected by the sensor unit, or a combination thereof.

The power-supply unit 190 may supply corresponding power to the display device 100. In particular, the controller 180 may be implemented as a System on Chip (SoC), a display 150 for displaying an image, and an audio output unit 160 for audio output.

Specifically, the power-supply unit 190 may include a converter (not shown) for converting AC power into DC power, and a DC/DC converter (not shown) for converting the level of DC power.

On the other hand, the power-supply unit 190 may receive power from the external power source, and may distribute the received power to the respective components. The power-supply unit 190 may be directly connected to the external power source to supply AC power, and may include a battery capable of being charged with electricity.

In the former case, the power-supply unit 190 may be used by connecting to a wired cable, and it is difficult for the power-supply unit 190 to move from one place to another place, and the movement range of the power-supply unit 190 is limited. In the latter case, the power-supply unit 190 can move from one place to another place, but the weight and volume of the power-supply unit 190 may increase as much as the weight and volume of the battery. In addition, for charging, the power-supply unit 190 should be directly connected to a power cable for a predetermined period of time or should be coupled to a charging cradle (not shown) for power supply.

The charging cradle may be connected to the display device through a terminal exposed to the outside. Alternatively, if the power-supply unit 190 approaches the charging cradle using a wireless interface, a built-in battery of the power-supply unit 190 may also be charged with electricity.

The remote controller 200 may transmit a user input to the user input interface unit 173. To this end, the remote controller 200 may use Bluetooth, Radio Frequency (RF) communication, infrared (IR) communication, Ultra-Wideband (UWB), ZigBee, or the like. In addition, the remote controller 200 may receive the image, voice, or data signal output from the user input interface unit 173, and may display or audibly output the received image, voice, or data signal.

On the other hand, the above-described display device 100 may be a fixed or mobile digital broadcast receiver capable of receiving digital broadcast signals.

Meanwhile, the block diagram of the display device 100 shown in FIG. 1 is disclosed for only for illustrative purposes for one embodiment of the present disclosure, and the respective components of the display device 100 shown in FIG. 1 can be integrated, added or omitted according to the specifications of the digital device 100 which is actually implemented.

That is, if necessary, two or more components may be combined into one component, or one component may be subdivided into two or more components. In addition, the functions performed in each block are intended to explain the embodiment of the present disclosure, and the specific operation or device does not limit the scope of the present disclosure.

Figure 2:
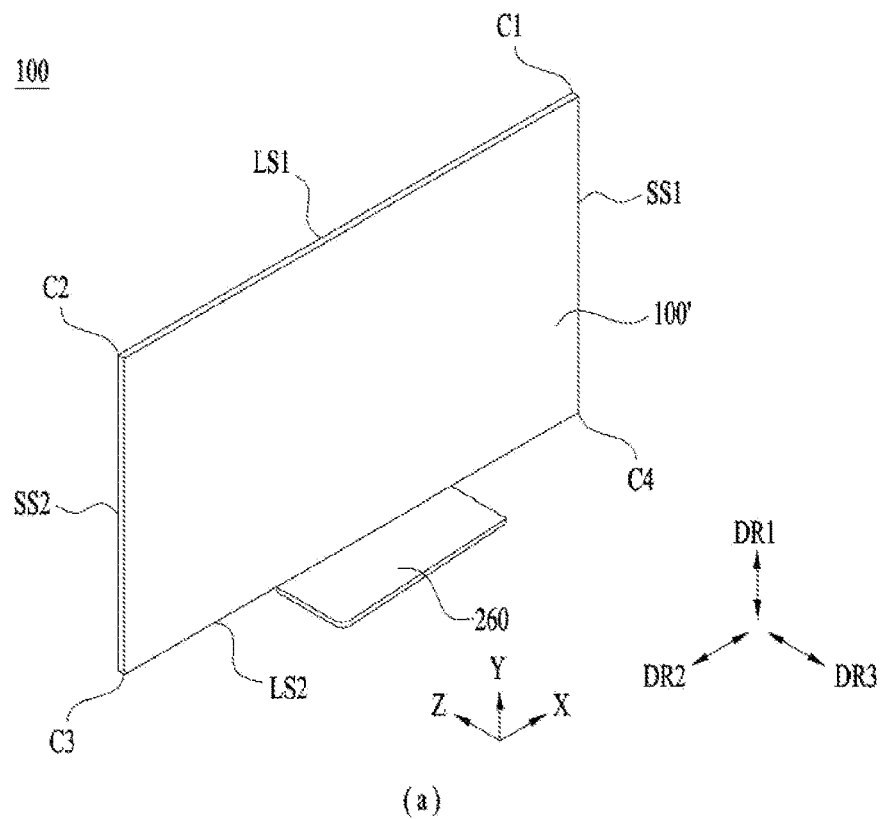
FIG. 2 is a perspective view illustrating an example of a display device according to an embodiment of the present disclosure.
Figure 2:
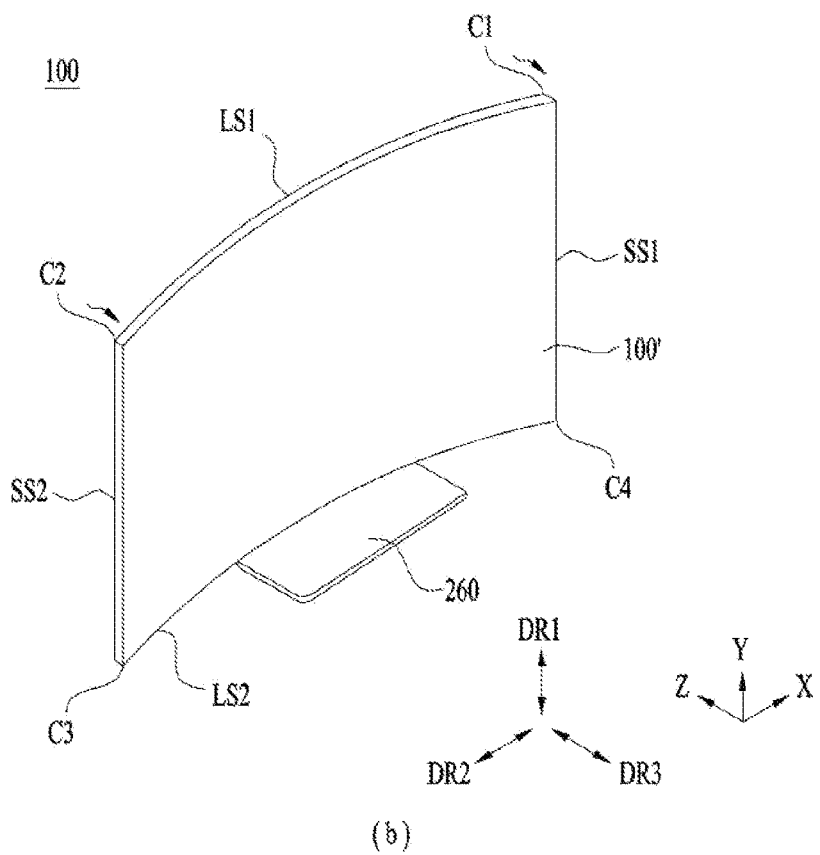

FIG. 2 is a perspective view illustrating an example of the display device according to an embodiment of the present disclosure.

Referring to FIG. 2, the display device 100 may have a rectangular body 100' including a first long side (LS1), a second long side (LS2) facing the first long side (LS1), a first short side (SS1) adjacent to the first long side (LS1) and the second long side (LS2), and a second short side (SS2) facing the first short side (SS1).

Here, the first short side area (SS1) is referred to as a first side area. The second short side area (SS2) is referred to as a second side area facing the first side area. The first long side area (LS1) is referred to as a third side area that is adjacent to the first side area and the second side area while being disposed between the first side area and the second side area. The second long side area (LS2) is referred to as a fourth side area that is adjacent to the first side area and the second side area while being disposed between the first side area and the second side area.

In addition, although the length of the first and second long sides LS1 and LS2 is longer than the length of the first and second short sides SS1 and SS2 as shown in FIG. 2, the scope of the present disclosure is not limited thereto, and the length of the first and second long sides LS1 and LS2 may also be approximately the same as the length of the first and second short sides SS1 and SS2 as needed.

In addition, the first direction (DR1) may be a direction parallel to each of the long sides LS1 and LS2 of the display device 100, and the second direction (DR2) may be a direction parallel to each of the short sides SS1 and SS2 of the display device 100. The third direction (DR3) may be a direction perpendicular to the first direction (DR1) and/or the second direction (DR2).

From another point of view, the side where the display device 100 displays an image may be referred to as a front side or a front surface. When the display device 100 displays an image, the side where no image is observed may be referred to as a back side or a back surface. When the display device 100 is viewed from the front side or the front surface, the first long side (LS1) may be referred to as an upper side or an upper surface. Similarly, the second long side (LS2) may be referred to as a lower side or a lower surface. Similarly, the first short side (SS1) may be referred to as a right side or a right surface, and the second short side (SS2) may be referred to as a left side or a left surface.

In addition, the first long side (LS1), the second long side (LS2), the first short side (SS1), and the second short side (SS2) may be referred to as an edge of the display device 100. A point where the first long side (LS1), the second long side (LS2), the first short side (SS1), and the second short side (SS2) meet each other may be referred to as a corner. For example, a point where the first long side (LS1) and the first short side (SS1) meet each other may be referred to as a first corner (C1). A point where the first long side (LS1) and the second short side (SS2) meet each other may be referred to as a second corner (C2). A point where the second short side (SS2) and the second long side (LS2) meet each other may be referred to as a third corner (C3). A point where the second long side (LS2) and the first short side (SS1) meet each other may be referred to as a fourth corner (C4).

Here, the direction from the first short side (SS1) to the second short side (SS2) or the direction from the second short side (SS2) to the first short side (SS1) may be referred to as a horizontal direction (LR). The direction from the first long side (LS1) to the second long side (LS2) or from the second long side (LS2) to the first long side (LS1) may be referred to as a vertical direction (UD).

The display device 100 according to the present disclosure may change the shape of the display module 150 using the LED or OLED instead of a liquid crystal, as shown in FIG. 2(*a*) or FIG. 2(*b*). That is, the backlight unit may be omitted, and the display device can be changed in shape within a predetermined range, so that the curved display device 100 can be implemented as shown in FIG. 2(*b*) using the above-described characteristics.

The display device 100 according to the present disclosure is a variable display device 100 in which a user can adjust a curvature according to a situation, rather than a curved display device fixed in a curved state. The display device 100 may further include a curvature adjustment unit capable of changing a curvature of the main body 100' configured to include the display module 150.

Figure 3:
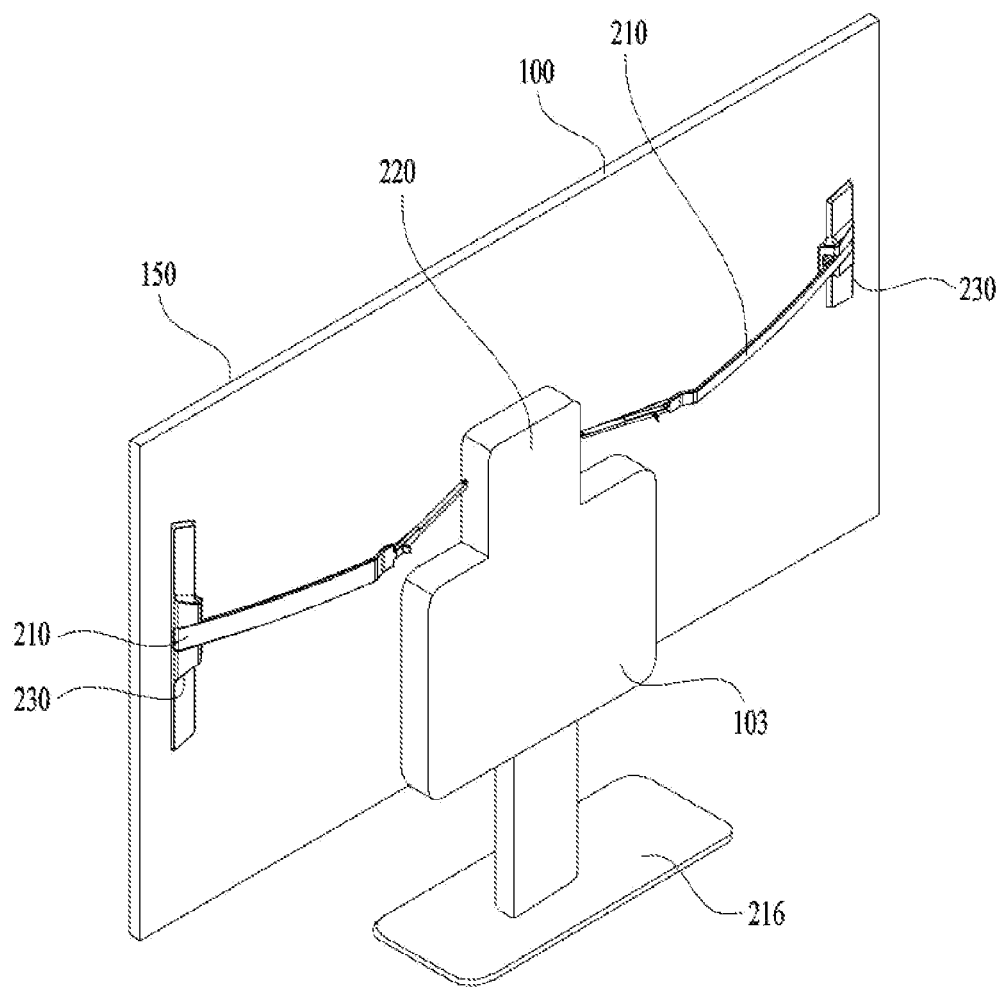
FIG. 3 is a rear view illustrating a display device according to an embodiment of the present disclosure.

FIG. 3 is a rear view illustrating the display device 100 according to an embodiment of the present disclosure. FIG.

Figure 4:
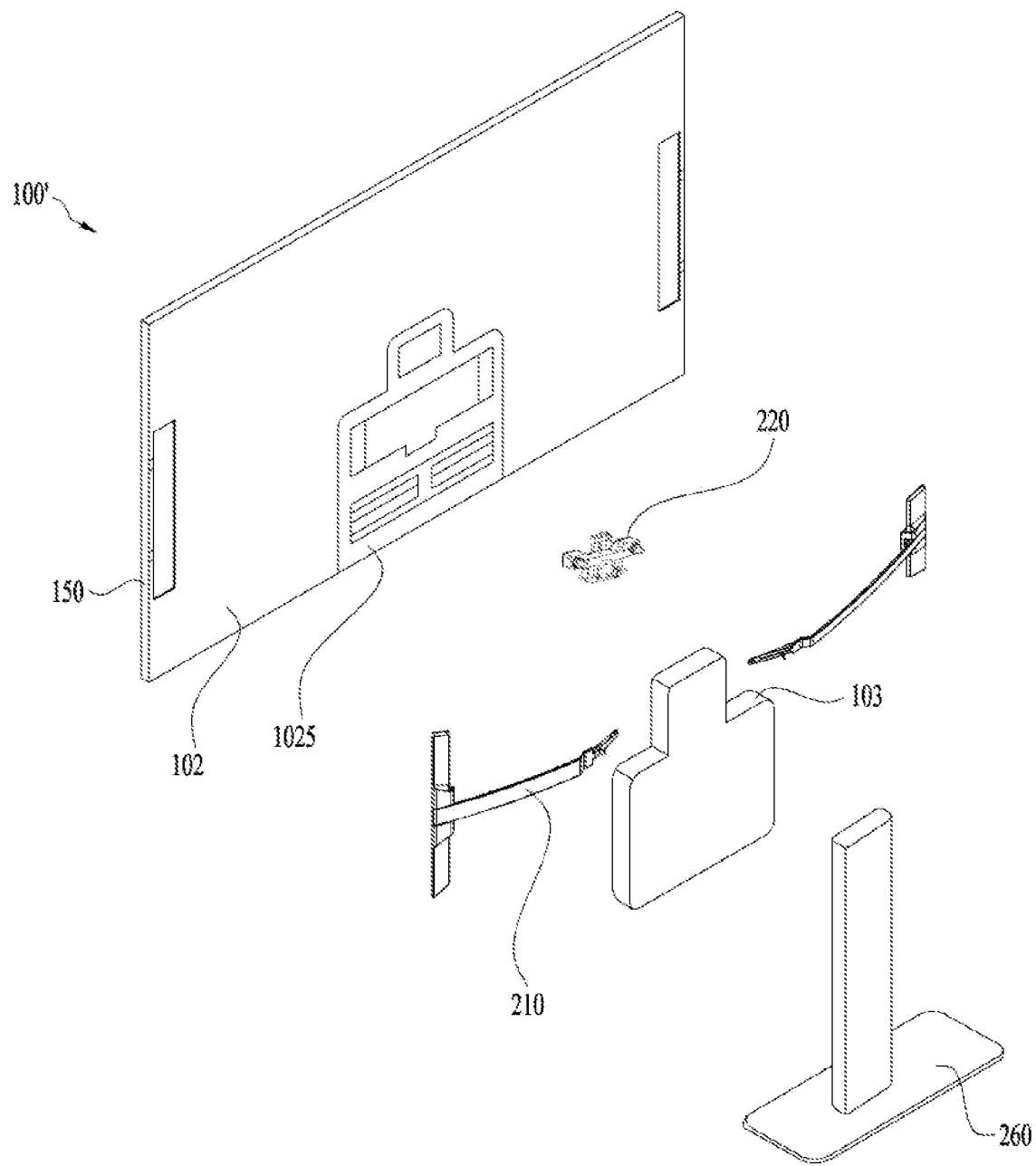
FIG. 4 is an exploded perspective view illustrating a display device according to an embodiment of the present disclosure.

4 is an exploded perspective view illustrating the display device 100 according to an embodiment of the present disclosure. Referring to FIGS. 3 and 4, the display device 100 may include a main body 100', a stand 260 for mounting the main body 100' on the floor, a controller 180, and curvature adjustment units 210, 220, and 230.

The main body 100' including the display module 150 may include a cover bottom 102 that covers a back surface of the display module 150 to which an image is output. A heat dissipation structure for discharging heat generated by the display module 150 may be provided at the inner surface of the cover bottom 102, and the main body 100' may further include a reinforcing material for reinforcing rigidity.

The cover bottom 102 may cover the back surface of the display module 150, may reinforce the rigidity of the display module 150, and may protect the back surface of the display module 150. In particular, the display module 150 may cover a driving IC of the display extending in a backward direction of the display module 150. A main substrate may be mounted on the back surface of the cover bottom 102 as a controller for controlling the display module 150, and a hole may be formed in the cover bottom 102 to interconnect the main substrate and the driving IC of the display module 150.

A separate bracket 1025 may be further provided so that the controller 180, such as a main board, can be mounted thereto. The display device 100 according to the present disclosure may further include a curvature adjustment unit for changing the curvature of the main body 100' other than the controller for controlling the display module 150 on the back surface of the cover bottom 102.

The curvature adjustment unit may further include a pair of links 210, a bending module 220 located at the center of the display device 100 and coupled to one end of the pair of links 210, and a pair of link brackets 230 disposed between the other end of the pair of links 210 and the cover bottom 102.

Figure 5:
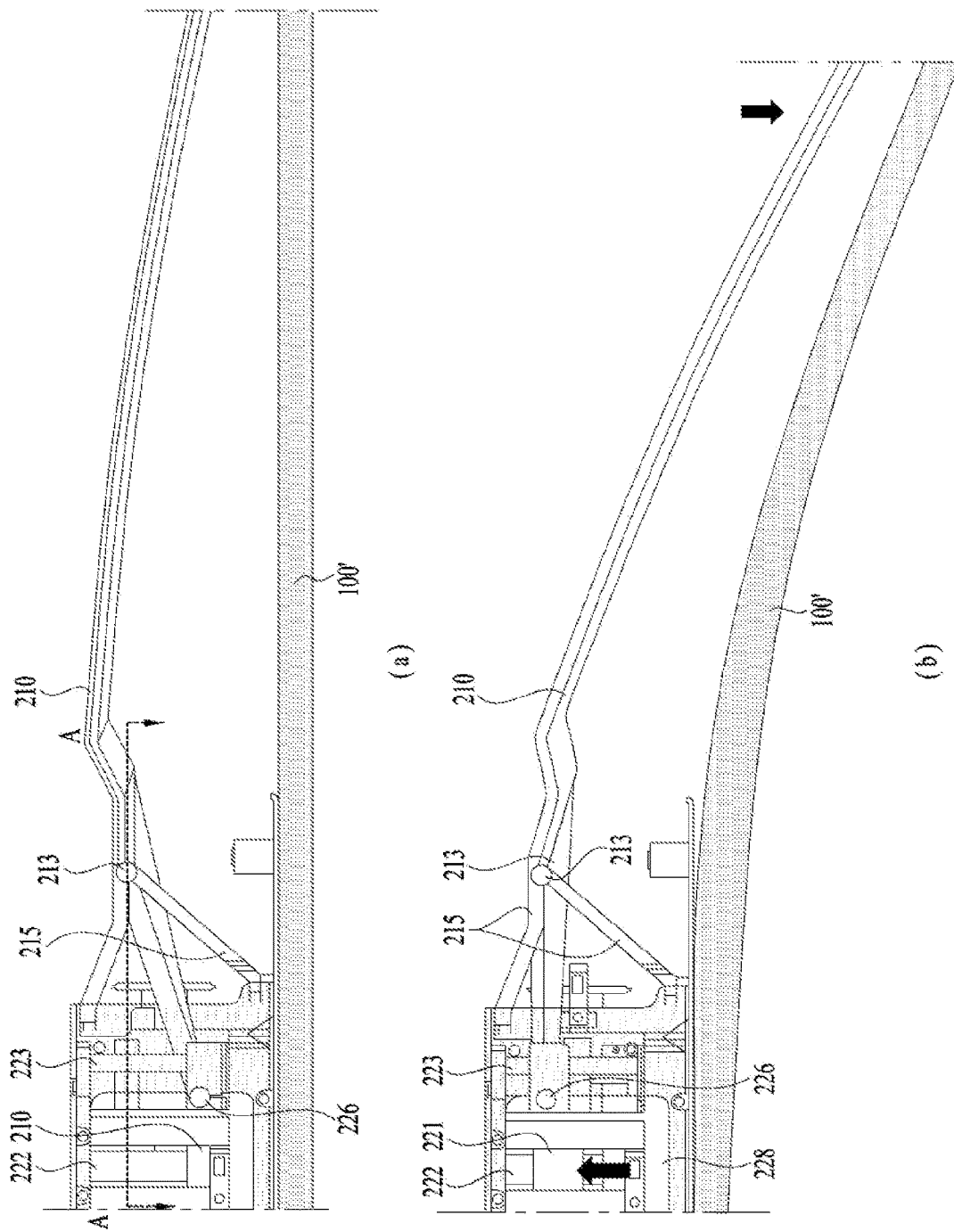
FIG. 5 is a top view illustrating a display device according to an embodiment of the present disclosure.

FIG. 5 is a top view illustrating the display device 100 according to an embodiment of the present disclosure. As shown in FIGS. 5(*a*) and 5(*b*), the curvature of the display device 100 may be changed according to the angle formed by the pair of links 210. The angle of the pair of links 210 may be adjusted according to a change in the position of the moving block 221 of the bending module 220.

The other end of the pair of links 210 may be slidably coupled to the link bracket 230. When the link bracket 230 is fixed to the link bracket 230, the curvature of the display module 150 is large at the end thereof so that it is difficult to implement a natural curved surface of the display module 150.

Accordingly, if the angle of the pair of links 210 is adjusted by the bending module 220, the other end of the link 210 slidably moves on the link bracket 230, so that a natural curved surface of the display module 150 can be implemented.

The bending module 220 may include a moving block 221 connected to one end of the link 210 and movable forward and backward, a guide shaft 222 for guiding the moving block 221 to move forward and backward without moving in the horizontal direction, and a module bracket 228 for receiving the bending module 220.

The link 210 is rotatably coupled to the link fixing portion 215 extending from the bending module 220. The link 210 may rotate around the link fixing pin 213 fastened to the link fixing portion 215, and one end and the other end of the link 210 may move in opposite directions.

When the user pulls the horizontal ends SS1 and SS2 of the main body 100' in a forward direction, the bending module 220 may allow the other end of the link 210 located on the horizontal ends SS1 and SS2 of the main body 100' to move in a forward direction, the link 210 may rotate around the link fixing pin 213, and one end of the link 210 may move in a backward direction.

In contrast, when the user pushes the horizontal ends SS1 and SS2 of the main body 100' in a backward direction so as to use the display device as a flat display, the other end of the link 210 may move backward and one end of the link 210 may move forward. A coupling position of the link fixing pin 213 may be located closer to one end of the link 210 than the other end of the link 210, and the movement distance of one end of the link 210 may be shorter than the movement distance of the other end of the link 210.

As described above, the user may manually change the curvature of the display device 100 by applying force to the horizontal ends SS1 and SS2 of the main body 100. At this time, the pair of links 210 is synchronized with the bending module 220 and simultaneously moved. As a result, the other side SS2 can also move at the same time when the user pulls or presses one side SS1 of the main body 100'.

However, according to the manual driving method, the user may apply force directly to the display module 150, there is a high risk of damage to the display module 150, and a motor is provided in the bending module 220, so that the curvature of the display module 150 can be changed.

For example, the guide shaft 222 may be formed in a spiral shape, and a spiral groove corresponding to the spiral of the guide shaft 222 may be formed in the moving block 221. When the motor rotates the guide shaft 222, the moving block 221 may move forward and backward.

When the moving block 221 of the bending module 220 moves backward, one end of the link 210 coupled to the moving block 221 moves backward, the other end of the link 210 moves forward, and the angle of the pair of links 210 may vary. The bending module 220 may induce a change in the angle of the links 210, and the display module 150 may again transition to the bent state or the flat state.

The display device 100 may further include a back cover 103 for covering the bending module 220 and the controller, and may further include a stand 260 for holding the main body 100' of the display device 100 on the floor. Instead of the stand 260, the display device 100 may further include a wall bracket that can be installed on the wall, and the stand 260 and the wall bracket may be coupled to the back cover 103.

Figure 6:
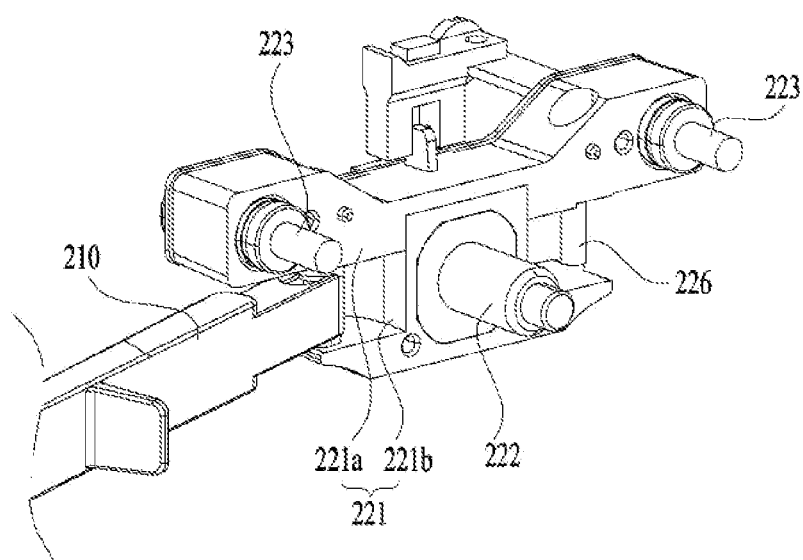
FIG. 6 is a perspective view illustrating another example of a bending module of a display device.

FIG. 6 is a view illustrating an example of the bending module 220 of the display device 100. Referring to FIG. 6, the moving block 221 of the present embodiment may move in a front and rear direction along the guide shaft 222 protruding from a rear surface of the main body 100'. One end of the link 210 may be coupled to the moving block 221, and may be pivotably coupled through an operation pin 226 such that an angle thereof may be changed based on the movement of the moving block 221.

The moving block 221 may be composed of two divided pieces 221*a* and 221*b* that are vertically coupled to each other as shown in FIG. 6 to fasten one end of the link 210, and the link 210 may be coupled to the moving block 221 while an upper block 221*a* covers the operation pin 226 located in a lower block 221*b*. The upper block 221*a* and the lower block 221*b* may be fastened to each other through a screw, and the screw may extend through the operation pin 226.

The screw (not shown) for fastening the upper block 221*a* and the lower block 221*b* to each other may be disposed to be spaced apart from the operation pin 226, and may extend through the operation pin 226.

Such structure of the moving block 221 composed of the two pieces 221a and 221b may have a good assembly characteristic, but durability of the operation pin 226 may be a problem as the operation pin 226 is made of aluminum, which is the same as a material of the moving block 221.

The screw extending through the operation pin may increase rigidity of the operation pin 226, but may increase a thickness of the operation pin 226, and sizes of the link 210 and the bending module 220 may also increase accordingly. In addition, the operation pin 226 may be damaged during the screw fastening, which may increase a defect rate during manufacturing.

When the operation pin 226, the moving block 221, and the link 210 are rubbed against each other, friction noise may occur and foreign matter resulted from the friction may occur. When usability is reduced due to the noise and the operation pin 226 is worn due to the friction, the durability is reduced.

To prevent the noise and improve the durability, there may be a tolerance between the link 210, the moving block 221, and the operation pin 226. However, there is a problem that the link 210 shakes due to a play between the link 210 and the moving block 221.

Figure 7:
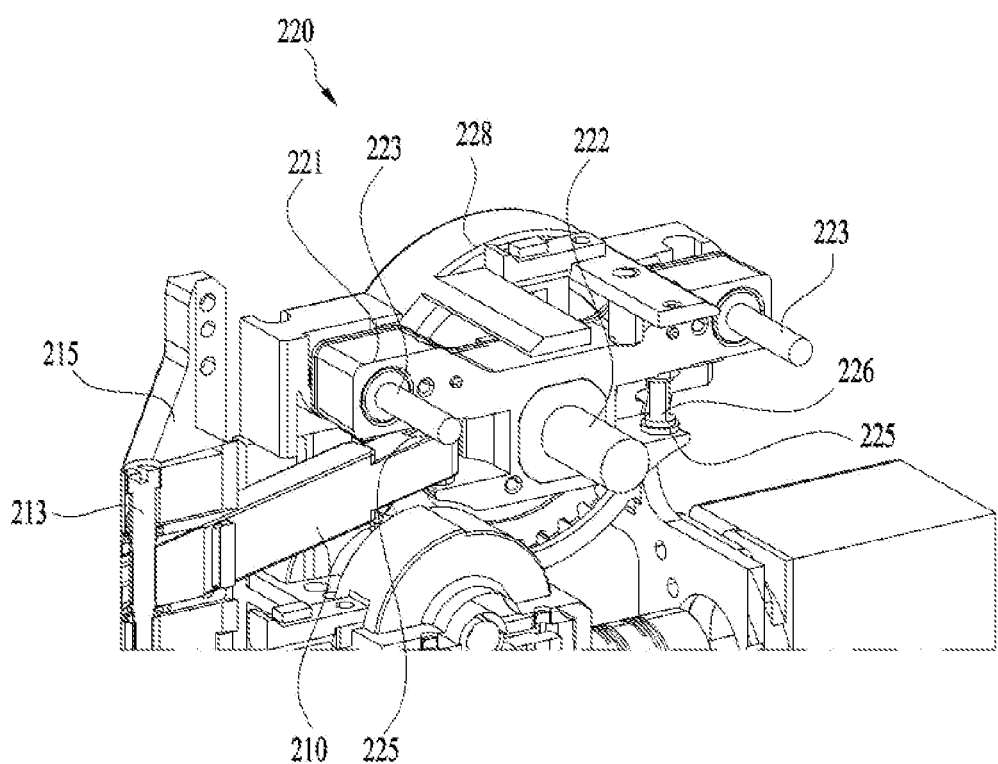
FIG. 7 is a perspective view illustrating another example of a bending module of a display device.
Figure 8:
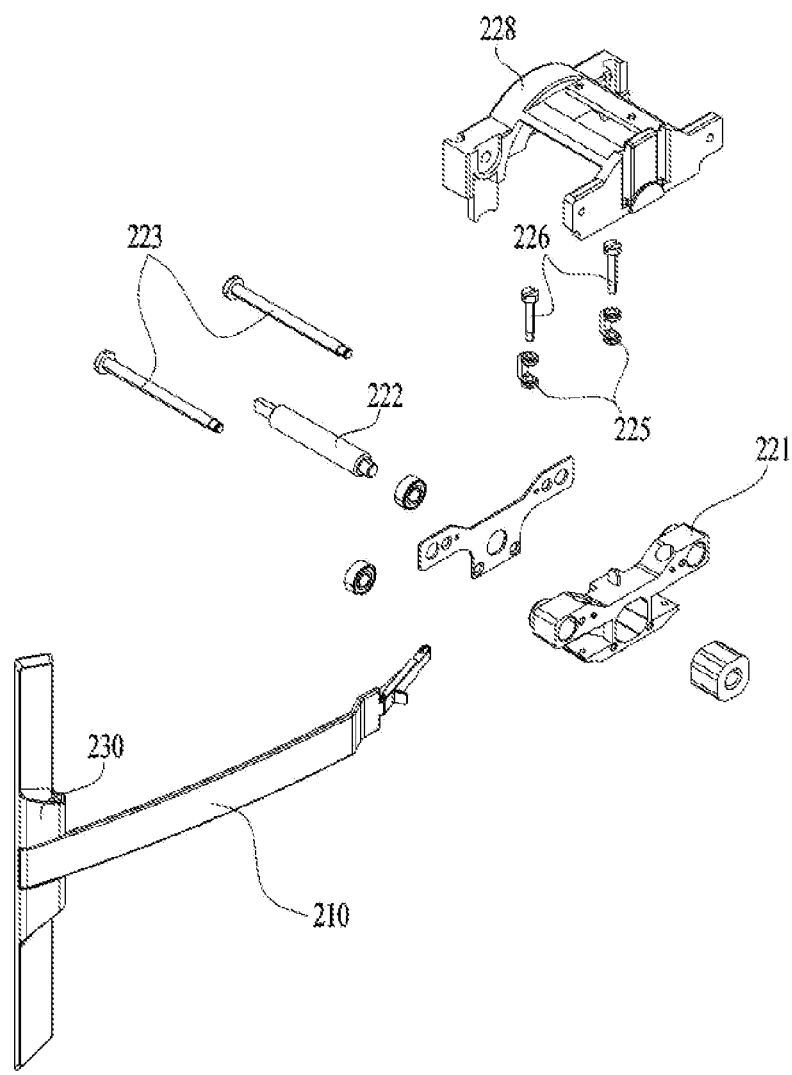
FIG. 8 is an exploded perspective view of a bending module in FIG. 7.

FIG. 7 is a perspective view showing another example of the bending module 220 of the display device 100, and FIG. 8 is an exploded perspective view of the bending module 220 in FIG. 7. The bending module 220 of the present embodiment may include the module bracket 228 coupled to the rear surface of the main body 100', and the guide shaft 222 may be located in the module bracket 228.

The module bracket 228 may include a first bracket 228a and a second bracket 228b respectively positioned at the front and rear of the guide shaft 222 as shown in FIG. 7. The guide shaft 222 may be positioned between the first bracket 228a and the second bracket 228b, and the first bracket 228a and the second bracket 228b may limit a moving distance of the moving block.

The guide shaft 222 may extend in the backward direction of the display device 100, and the moving block 221 may move in the front and rear direction along the guide shaft 222. The moving block 221 may further include an auxiliary shaft 223 to move linearly without rotating about the guide shaft 222.

The auxiliary shaft 223 may be spaced apart from the guide shaft 222 and extend parallel to the guide shaft 222, and may be located between the first bracket 228a and the second bracket 228b like the guide shaft 222.

The auxiliary shaft 223 may extend through the moving block 221, and the auxiliary shaft 223 may include two or more auxiliary shafts for left and right balance as shown in FIG. 6. The auxiliary shaft 223 must be located as far apart as possible from the guide shaft 222 to support the linear motion of the moving block 221 more stably, so that the auxiliary shaft 223 may be located at a corner of the module bracket 228.

Because the moving block 221 of the present embodiment is composed of one piece, the screw for fastening the upper block 221a and the lower block 221b to each other may be omitted as in the embodiment in FIG. 6. Because the thickness of the operation pin 226 does not increase due to the screw, the size of the bending module 220 may be reduced.

Figure 9:
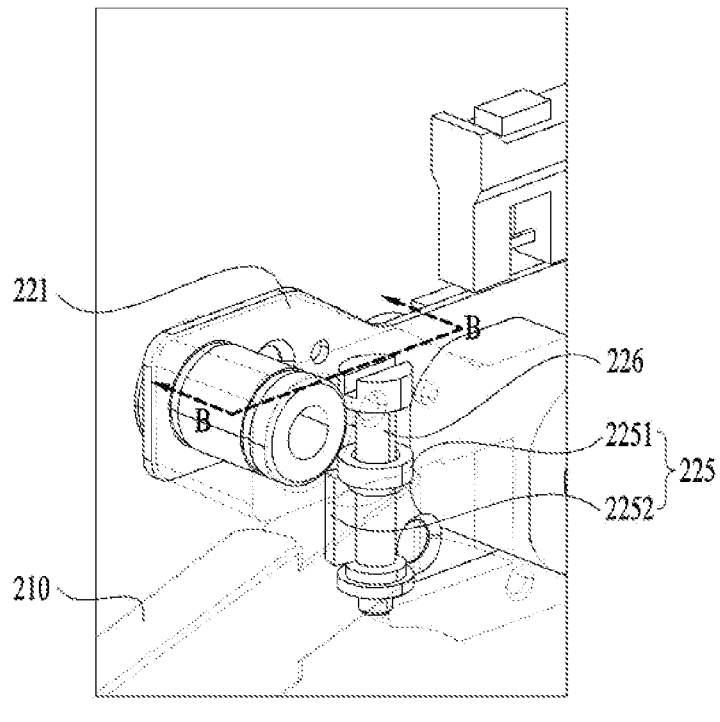
FIG. 9 shows a perspective view and a cross-sectional view illustrating a fastened state of a moving block and a link.
Figure 9:
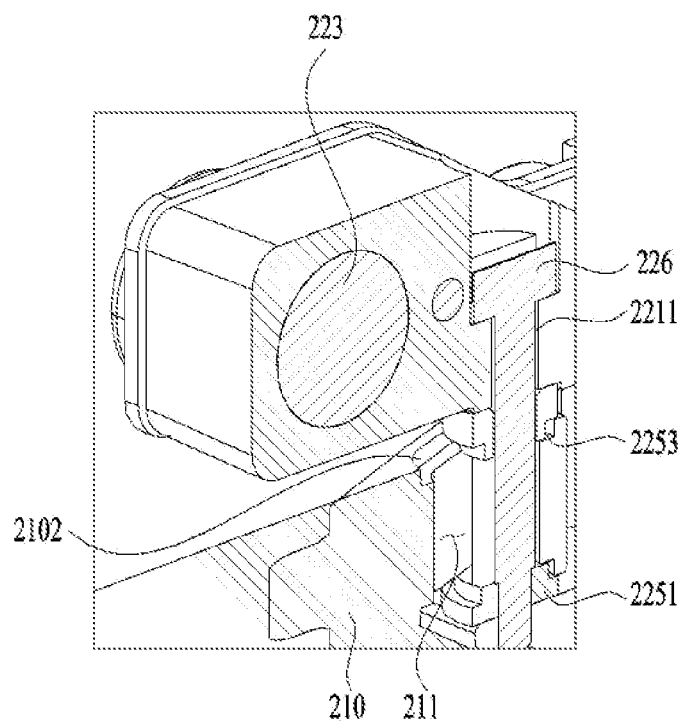

FIG. 9 shows a perspective view and a cross-sectional view showing a fastened state of the moving block 221 and the link 210, (a) is the perspective view, and (b) is a cross-sectional view of (a) taken along a line B-B. The operation pin 226 for fastening the link 210 may be formed separately from the moving block 221, and the link 210 may be fastened by inserting the operation pin 226 into the moving block 221.

The operation pin 226 may extend through a first through-hole 2211 defined in the moving block 221 and a pinhole 211 defined at one end of the link 210, so that the link 210 and the moving block 221 may be coupled to be pivotable around the operation pin 226.

In the case of the embodiment in FIG. 6, the screw needs to be constructed such that an entire outer circumferential surface is formed in a spiral shape in order to provide a strong fastening force such that the upper block 221a and the lower block 221b are not separated from each other.

However, the operation pin 226 of the present embodiment only serves to transmit a force when one end of the link moves, so that a large force is not applied thereto. Accordingly, the operation pin 226 may include a spiral only in a portion corresponding to the first through-hole 2211 defined in the moving block 221.

Because the operation pin 226 may be composed of a separate piece from the moving block 221, a material of the operation pin 226 may be stronger than that of the moving block 221. The moving block 221 may use a light metal such as aluminum to lighten a weight of a product, and the operation pin 226 may use a rigid material such as SUS. The aluminum is light but is able to be damaged easily, so that, when the operation pin 226 is made of the SUS, the durability may be improved.

In addition, the present embodiment may further include a mold bush 225 positioned between the moving block 221 and the link 210, and the mold bush 225 may use a resin such as polyacetal that is strong in the friction rather than a metal material. The mold bush 225 may reduce friction noise and wear resulted from friction occurred by contact between metals. As the mold bush 225 is interposed, the metals (the link 210 and the moving block 221) do not contact each other, so that the wear and the noise may be reduced.

The present embodiment forming the operation pin 226 as the separate member from the moving block 221 may reduce the tolerance than an embodiment in which the operation pin 226 is formed integrally with the moving block 221 and may minimize the noise through the mold bush 225. Therefore, by minimizing a gap between the link 210 and the mold bush 225, it is possible to prevent the link 210 from shaking due to the play.

In the moving block 221, portions to which the links 210 are respectively coupled on left and right sides are concave, and the operation pins 226 are respectively inserted into the portions from the above. The mold bush 225 may include a pair of contact portions 2251 positioned at a top and a bottom of the pinhole 211 and a connection portion 2252 connecting the pair of contact portions 2251 to each other.

The connection portion 2252 may extend in a vertical direction parallel to the operation pin 226 at a location spaced apart from the operation pin 226 so as not to interfere with the operation of the link 210. As shown in (a) in FIG. 9, the pair of contact portions 2251 and the connection portion 2252 may form a U-shape.

The contact portion 2251 may further include a second through-hole through which the operation pin 226 extends. As shown in (b) in FIG. 9, the operation pin 226 may extend through the first through-hole 2211 of the moving block 221, the second through-hole of the mold bush 225, and the pinhole 211.

Figure 10:
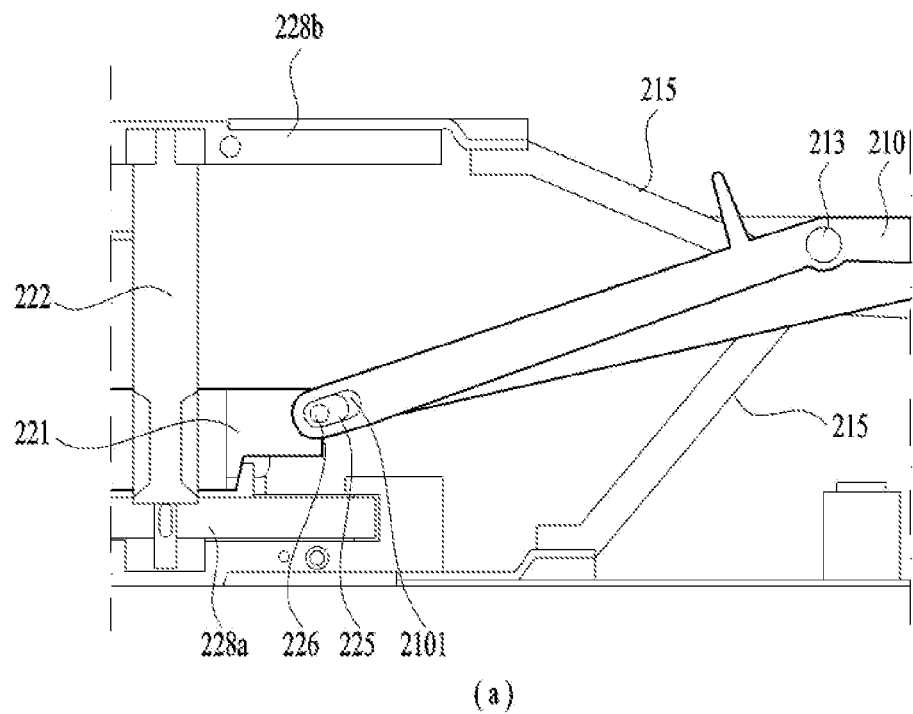
FIG. 10 is a view illustrating operations of a bending module and a link of a display device.
Figure 10:
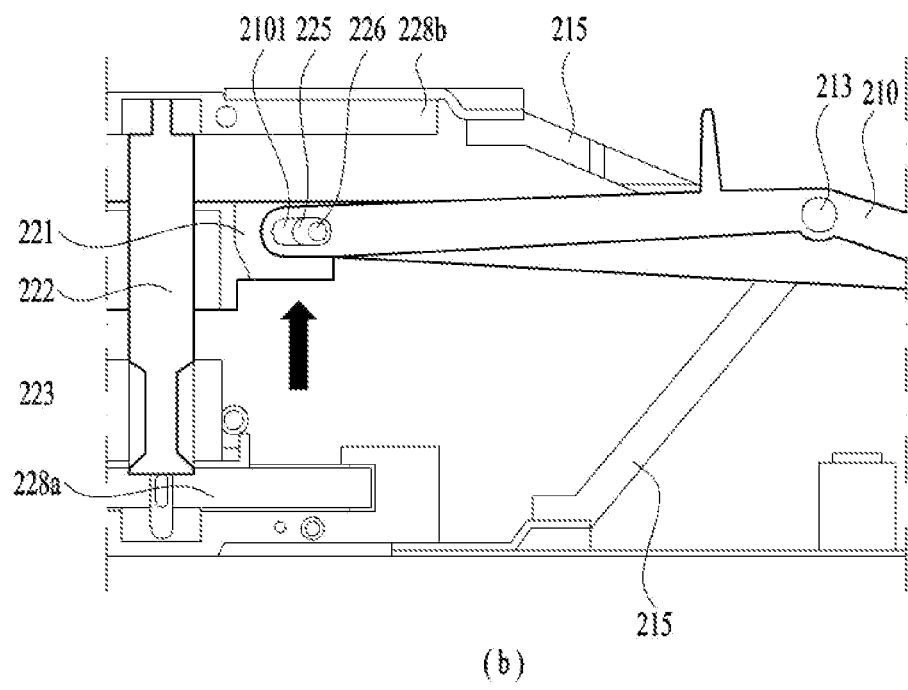

FIG. 10 is a view showing operations of the bending module 220 and the link 210 of the display device 100. The link 210 may be fixed to be pivotable around a link fixing pin 213 by a link fixing portion 215 extended from the module bracket 228 of the bending module 220. The link fixing portion 215 may be connected to each of the first bracket 228a and the second bracket 228b to support the link 210 to be stably driven around the link fixing pin 213.

The link 210 pivots as a position of the moving block 221 changes while a position of a center of pivot of the link 210 to which the link fixing pin 213 is connected with respect to the bending module 220 does not change. However, when the moving block 221 moves, a distance between the center of pivot 213 of the link 210 and the pinhole 211 does not change, but a distance between the operation pin 226 inserted into the pinhole 211 of the link 210 and the link fixing pin 213 changes.

To compensate for such difference, the pinhole 211 defined at one end of the link 210 may extend long in a longitudinal direction of the link 210. As shown in FIG. 10, a position of the operation pin 226 on the pinhole 211 may vary depending on the position of the moving block 221. That is, an extended length of the pinhole 211 may be a length corresponding to the change in the distance between the operation pin 226 and the link fixing pin 213 when the moving block 221 moves.

The contact portions 2251 may include protrusions 2253 and 2254 that protrude while forming a step as shown in (b) in FIG. 9 in order to minimize the play between the moving block 221 and the link 210.

A first protrusion 2253 facing the link 210 may be inserted into a first groove 2102 defined in the pinhole 211 of the link 210, and a second protrusion 2254 facing the moving block 221 may be inserted into a second groove 2212 defined in the first through-hole 2211 of the moving block 221 and may be fastened while minimizing the gap between the moving block 221 and the link 210.

One end of the link 210 may change in the angle by the bending module 220 and the other end of the link 210 may be fastened to the link bracket 230 located at each of left and right ends of the display module 150 as shown in FIG. 3.

The link 210 provides the main body 100' with a pulling force in the backward direction or a pushing force in the forward direction via the bending module 220. As a thickness of the display module 150 and a thickness of the main body 100' become smaller, the display module 150 on which the link bracket 230 is located may look uneven.

To solve such problem, it is necessary to provide enough force to cause bending deformation at a horizontal end of the display module 150 while at the same time construct the screen of the display module 150 to form a smooth surface.

In particular, as shown in FIG. 5, the link 210 changes in the angle and the main body 100' undergoes the bending deformation. A center of the main body 100' has the same position with respect to the bending module 220 in both (a) and (b), but the horizontal end may change in the angle and the distance based on the bending deformation. In the link 210, the other end moves in the forward direction like a lever as the position of one end changes. Thus, the link 210 is not subjected to the bending deformation, but pivots.

In order for the other end of the link 210 to be positioned at the horizontal end of the main body 100' in a state in which the main body 100' is bent, a length of the link 210 should be greater. Although an overall length of the main body 100' does not change, in order to solve a problem that the other end of the link 210 does not reach the horizontal end of the main body 100' due to the bending, the link bracket 230 and the link 210 may be slidably coupled.

Figure 11:
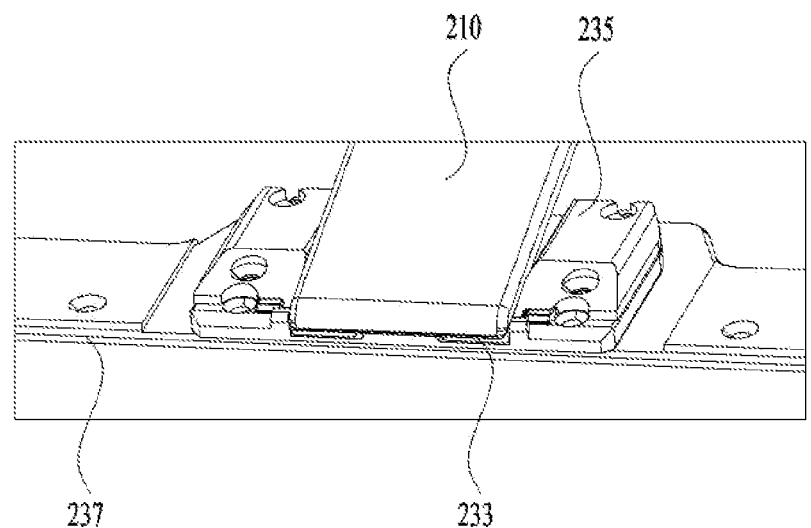
FIG. 11 is a view showing a fastened state of a link and a link bracket of a display device.
Figure 11:
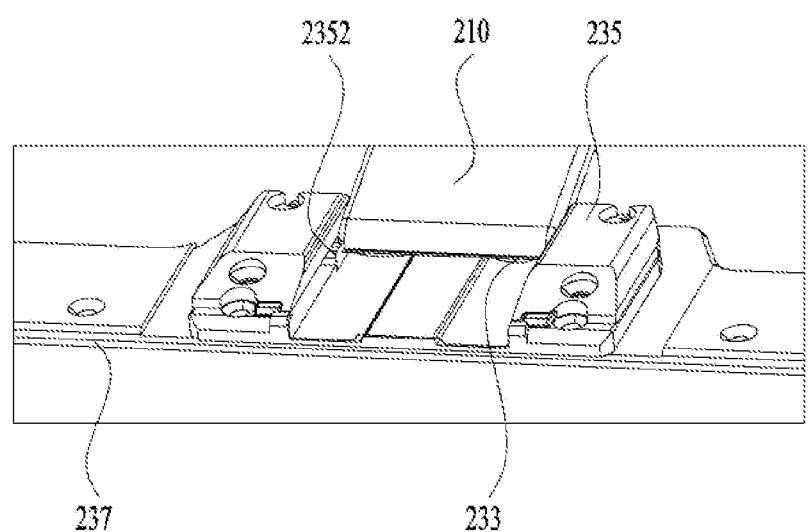

FIG. 11 is a view illustrating a fastening state of the link 210 and the link bracket 230 of the display device 100. (a) illustrates the link 210 and the link bracket 230 in a state in which the display module 150 is flat, and (b) illustrates the link 210 and the link bracket 230 in a state in which the display module 150 is bent.

Figure 12:
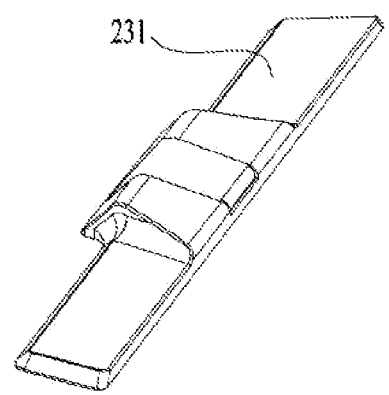
FIG. 12 is an exploded perspective view of a link and a link bracket of a display module.
Figure 12:
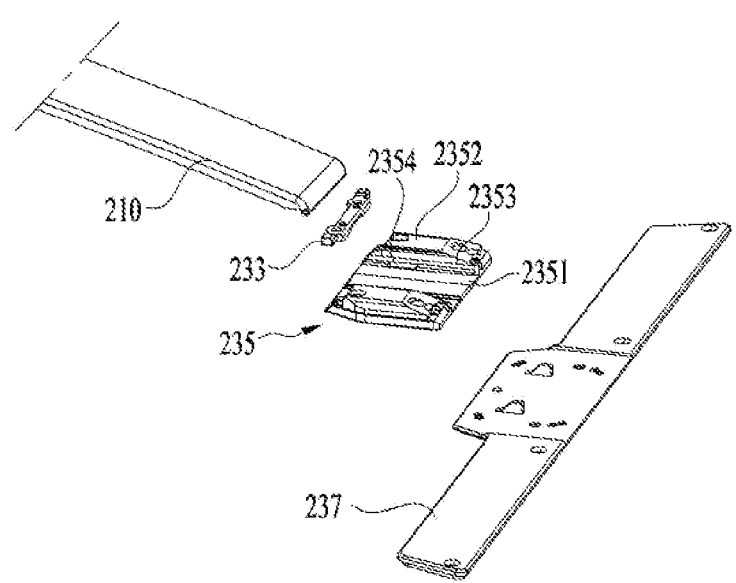

FIG. 12 is an exploded perspective view of the link 210 and the link bracket 230 of the display device 100. The link bracket 230 may include a fastened plate 237 coupled to a rear surface of the main body 100', a link side block 235 coupled to the fastened plate 237, and a moving bar 233 coupled to the other end of the link 210 and in contact with the link side block 235.

The fastening plate 237 may be coupled to the cover bottom 102 of the main body 100', may be screwed at the horizontal end as shown in FIG. 12, and may use the metal material such as the aluminum.

When the link 210 is directly in contact with the fastening plate 237, the noise may be generated due to the friction between the metals. Therefore, the link side block 235 made of a friction-resistant and lubricating material, such as the polyacetal, may be used at a portion where the other end of the link 210 slides.

The link side block 235 may be fixed to the fastening plate 237, and may have a smaller area than the fastening plate 237.

Because the link 210 is the metal and the link side block 235 is a relatively weak injection-molded product, there is a problem in that wear of the link side block 235 is relatively severe. The other end of the link 210 may further include the moving bar 233 made of the resin such as the polyacetal to reduce the wear of the link side block 235.

In addition, because the moving bar 233 slides on the link side block 235, even when both the moving bar 233 and the link side block 210 are made of the resin, the moving bar 233 may use a material having a higher rigidity than a material of the link side block 235.

Figure 13:
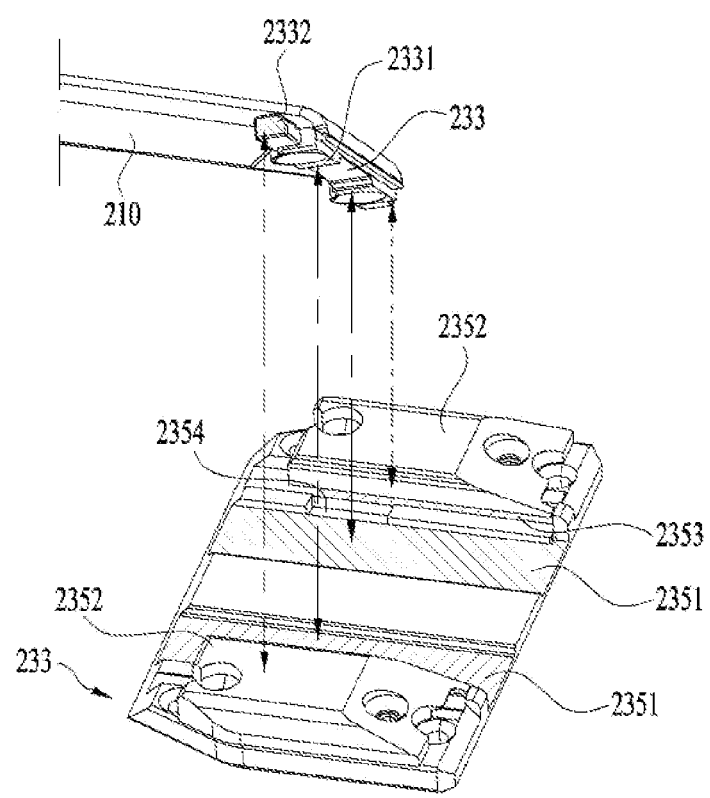
FIG. 13 is a view illustrating a contact surface between a moving bar and a link side block of a display device.

FIG. 13 is a view illustrating a contact surface between the moving bar 233 and the link side block 235. When the contact surface between the moving bar 233 and the link side block 235 is wide, noise may occur and the slide movement may not be smooth, so that the moving bar 233 may include a protruding friction portion 2331 to reduce the surface in contact with the slide block of the link 210.

The link side block 235 may include a side wall 2352 facing a side surface of the link 210 (in a vertical direction of the display device 100) as shown in FIG. 13. The side wall 2352 may serve to support the link 210 so as not to move in the vertical direction. Therefore, because the side wall 2352 and the link 210 also in contact with each other, the moving bar 233 may further include a friction portion 2332 protruding from a surface thereof facing the side wall 2352 as shown in FIG. 13.

An entirety of the link side block 235 may be made of the polyacetal (POM: Poly Oxy Methylen), or only the surfaces 2351 and 2353 in contact with the friction portions of the moving bar 233 may use the polyacetal.

A stopper 238 protruding from the link side block 235 to limit a horizontal moving distance of the link 210 may be further included. The stopper 238 may be formed to protrude on the link side block 235, or may protrude from the fastened plate 237 and protrude toward the link 210 through the link side block 235 as shown in FIG. 12.

The stopper 238 of the present embodiment is formed only at a position that limits the moving distance of the link 210 when the display device 100 is bent, but a stopper 238 located outwardly of the link 210 to stop the link 210 even when the state of the display device 100 is switched to the flat state may be further included. In the present embodiment, a bracket cover 231 for covering the link side block 235 may form a step outwardly of the moving bar 233 and may replace the outer stopper 238.

The bracket cover 231, which is a member that covers the link side block 235 and the fastened plate 237, covers a screw or the like for fixing the link side block 235 and the fastened plate 237 so as not to be exposed. As shown in FIG. 12, only a portion of the bracket cover 231 corresponding to the link 210 may be opened such that the link 210 may move.

Figure 14:
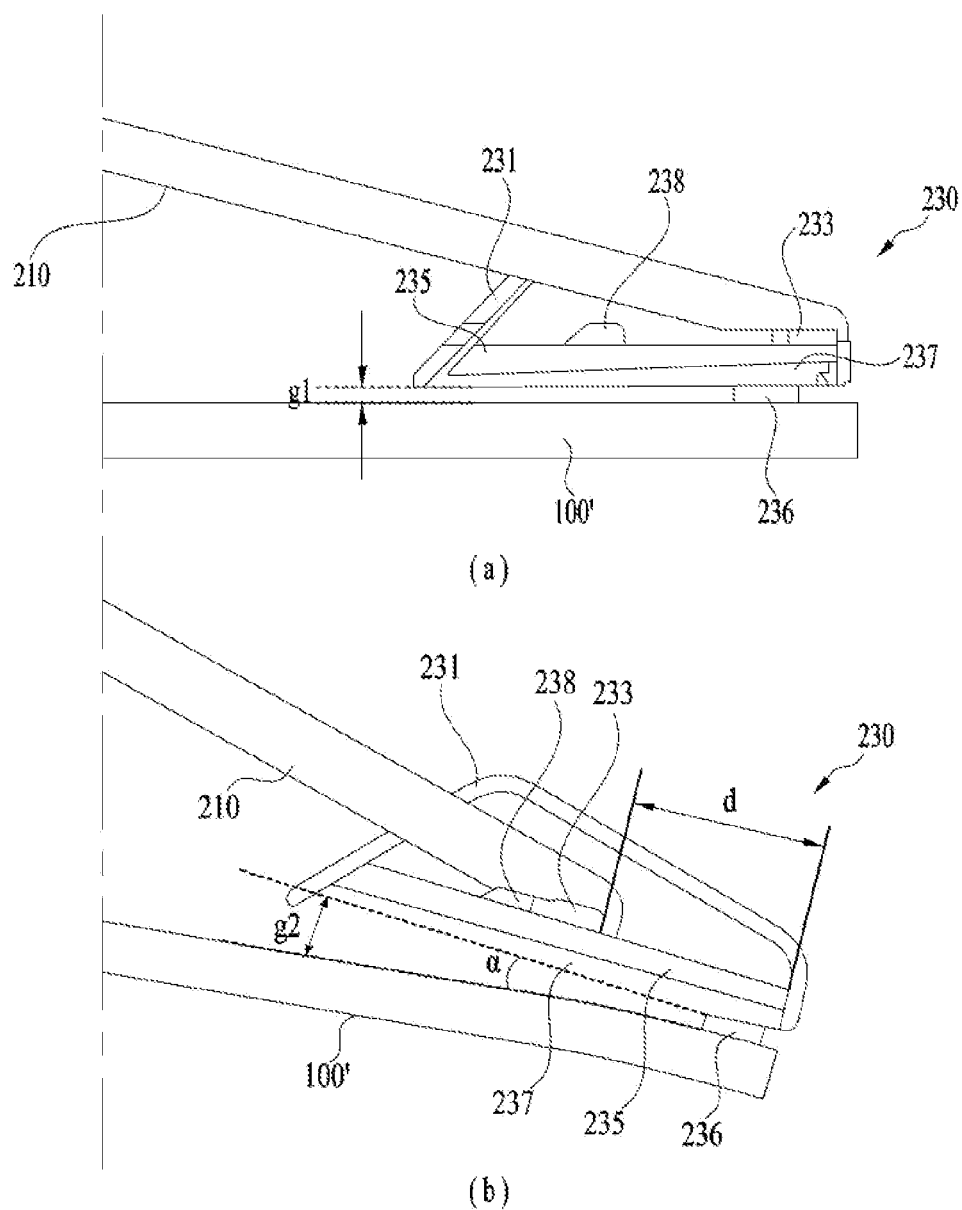
FIG. 14 is a view illustrating arrangement of a link and a link bracket in a flat state and a curved state of a display device.

FIG. 14 is a view illustrating arrangement of the link 210 and the link bracket 230 in the flat state and the curved state of the display device 100. As shown in (a) in FIG. 14, the fastened plate 237 may be fastened to the main body 100' via a bracket fastener 236 at an end of the main body 100'. For convenience of description, a portion at the horizontal end of the main body 100' that is coupled to the rear surface of the main body 100' will be referred to as a first portion of the fastened plate 237, and a portion facing the horizontal center of the main body 100' will be referred to as a second portion of the fastened plate 237.

When only the first portion of the fastened plate 237 is fastened with the main body 100', as shown in FIG. 14, an angle α of the link bracket 230 formed on the rear surface of the display module 150 may be adjusted. When the display device 100 is bent, the main body 100' is deformed into a curved surface having a predetermined curvature, but the link 210 does not change in the curvature but changes in the oriented direction, so that an angle of the other end of the link 210 may be different from an angle of the horizontal end of the main body 100'.

The other end of link 210 may have an angle steeper than the angle of the horizontal end of the main body 100' (may have a greater angle with the surface of the display module 150 in the flat state). Therefore, when an entirety of the surface including the second portion of the link bracket 230 is fixed to the rear surface of the main body 100' with the screw or the like, a press mark may appear where the link bracket 230 is coupled when the main body 100' is bent.

Only the first portion of the fastened plate 237 may be fastened with the main body 100' via the fastener 236 and the second portion may not be fastened via the fastener 236 as shown in (a) in FIG. 14 such that the press mark is not visible at horizontal ends SS1 and SS2 of the display module 150 during the bending.

When only the end of the fastened plate 237 is fastened with the main body 100' as such, while the second portion is spaced apart (g2>g1) from the rear surface of the main body 100', and an angular difference between the other end of the link 210 and the horizontal end of the main body 100' may be compensated for when the main body 100' is bent as shown in (b) in FIG. 14.

An inclined surface may be formed on the rear surface of the link bracket 230, that is, on a surface of the rear surface of the link side block 235, to compensate for the angular difference between the link 210 and the main body 100'. An inclination (for example, about 2°) may be formed such that a region corresponding to the second portion further protrudes in the backward direction. That is, the angular difference between the main body 100' and the link 210 may be compensated for because inclinations of the front and rear surfaces of the link side block 235 are different.

The display device 100 of the present disclosure may switch the state of the display module 150 into the flat state or the bent state, so that the user may use the display device 100 in a desired shape.

The usability of the display device 100 may be improved by eliminating an irregular curvature of the display module 150 that occurs during the bending and reducing the noise caused by the friction between the members.

In addition, the durability of the display device 100 may be improved using the material that may minimize the wear resulted from the friction occurring during the bending. The above detailed description should not be construed as restrictive in all respects and should be considered as illustrative. The scope of the present disclosure should be determined by a reasonable interpretation of the appended claims, and all changes within the equivalent scope of the present disclosure are included in the scope of the present disclosure.

The invention claimed is:

1. A display device comprising:
a main body including a display for outputting an image;
a bending assembly located at a center of a rear surface of the main body;
a pair of links including a first link and a second link,
wherein the first link extends along a leftward direction, and
wherein the second link extends along a rightward direction, and
wherein one end of the first link and one end of the second link are coupled to the bending assembly; and
link brackets including a first link bracket and a second link bracket,
wherein the first link bracket is located at a left end of the main body,
wherein the second link bracket is located at a right end of the main body,
wherein the other end of the first link is connected to the first link bracket,
wherein the other end of the second link is connected to the second link bracket,
wherein the bending assembly is configured to change an angle of the pair of links,
wherein, based on the bending assembly being driven, the other end of the first link slides horizontally with respect to the first link bracket, and the other end of the second link slides horizontally with respect to the second link bracket,
wherein the first link includes a first moving bar located on a surface facing the first link bracket at the other end of the first link,
wherein the second link includes a second moving bar located on a surface facing the second link bracket at the other end of the second link,
wherein the first link bracket includes a first link side block in contact with the first moving bar,
wherein the second link bracket includes a second link side block in contact with the second moving bar, and
wherein the first moving bar and the second moving bar are configured to slide within the first link side block and the second link side block, respectively.

2. The display device of claim 1,
wherein the first link side block includes:
a first slide portion parallel to the rear surface of the main body; and
first side walls located at a top and a bottom of the other end of the first link, and wherein the second link side block includes:
a second slide portion parallel to the rear surface of the main body; and
second side walls located at a top and a bottom of the other end of the second link.

3. The display device of claim 2,
wherein the first moving bar includes:
a first friction portion protruding toward the first slide portion; and
a second friction portion protruding toward one of the first side walls, and
wherein the second moving bar includes:
a third friction portion protruding toward the second slide portion; and
a fourth friction portion protruding toward one of the second side walls.

4. The display device of claim 3, wherein the first link side block, the first moving bar, the second link side block and the second moving bar comprise polyacetal (POM: Poly Oxy Methylen).

5. The display device of claim 4, wherein a hardness of the first moving bar is greater than a hardness of the first side block, and
wherein a hardness of the second moving bar is greater than a hardness of the second side block.

6. The display device of claim 1, further comprising:
a first bracket fastener for fastening the main body with a first portion of the first link bracket located at a first horizontal end of the display device; and
a second bracket fastener for fastening the main body with a first portion of the second link bracket located at a second horizontal end of the display device,
wherein a second portion of the first link bracket located at a horizontal center of the display device and a second portion of the second link bracket located at the horizontal center of the display device are not fastened to the rear surface of the main body.

7. The display device of claim 6, wherein, based on the main body being bent, a gap between the second portion of the first link bracket and the rear surface of the main body is widened, and a gap between the second portion of the second link bracket and the rear surface of the main body is widened.

8. The display device of claim 1, wherein a rear surface of the first link bracket includes a first inclined surface rearwardly extending from a first horizontal end of the display device toward a center, and
wherein a rear surface of the second link bracket includes a second inclined surface rearwardly extending from a second horizontal end of the display device toward the center.

9. The display device of claim 1, wherein the first link bracket includes a first stopper for restricting the sliding of the first link, and
wherein the second link bracket includes a second stopper for restricting the sliding of the second link.

10. The display device of claim 1, further comprising a first bracket cover for covering the first link bracket and a second bracket cover for covering the second link bracket,
wherein the first bracket cover is configured to restrict a movement of the first link towards a first horizontal end of the display device, and
wherein the second bracket cover is configured to restrict a movement of the second link towards a second horizontal end of the display device.

* * * * *